United States Patent [19]
Lee

[11] Patent Number: 4,746,823
[45] Date of Patent: May 24, 1988

[54] VOLTAGE-INSENSITIVE AND TEMPERATURE-COMPENSATED DELAY CIRCUIT FOR A MONOLITHIC INTEGRATED CIRCUIT

[75] Inventor: Robert D. Lee, Denton, Tex.

[73] Assignee: Dallas Semiconductor Corporation, Dallas, Tex.

[21] Appl. No.: 881,136

[22] Filed: Jul. 2, 1986

[51] Int. Cl.$^4$ .................. H03K 5/13; H03K 17/56; H03K 3/26
[52] U.S. Cl. .................. 307/601; 307/246; 307/303; 307/310
[58] Field of Search ............. 307/601, 310, 303, 246, 307/494, 265, 605

[56] References Cited

U.S. PATENT DOCUMENTS

| | | | |
|---|---|---|---|
| 3,073,971 | 1/1963 | Daigle, Jr. | 307/601 |
| 3,073,972 | 1/1963 | Jenkins | 307/601 |
| 4,110,640 | 8/1978 | Ito | 307/303 |
| 4,521,694 | 6/1985 | Ryzek et al. | 307/601 |

*Primary Examiner*—Stanley D. Miller
*Assistant Examiner*—B. P. Davis
*Attorney, Agent, or Firm*—Leonard & Lott

[57] ABSTRACT

A delay circuit which is insensitive to variations in power supply voltage, which is temperature-compensated, and which is suitable for fabrication in a monolithic integrated circuit includes circuitry for charging a capacitive element through a resistive element from GND toward the power supply voltage. The voltage across the capacitive element is compared to a reference voltage by a voltage comparator, and the voltage comparator generates an output signal when the voltage on the capacitor becomes greater than the reference voltage. The reference voltage for the comparator is generated by a resistor divider connected between GND and the power supply voltage. Inasmuch as the reference voltage varies with changes in the power supply voltage in such a manner as to be maintained at a substantially fixed percentage of the power supply voltage, the time delay provided by the delay circuit is essentially independent of variations in power supply voltage. By utilizing resistors in the resistor divider that have differing temperature coefficients of resistance, the reference voltage for the comparator can be increased and decreased in a predetermined manner in response to increases and decreases in ambient temperature, allowing the time delay of the delay circuit to be adjusted in a predetermined manner as a function of temperature.

9 Claims, 2 Drawing Sheets

VOLTAGE-INSENSITIVE AND TEMPERATURE-COMPENSATED DELAY CIRCUIT FOR A MONOLITHIC INTEGRATED CIRCUIT

TECHNICAL FIELD

This invention generally relates to digital electronic circuits and, more particularly, to delay circuits suitable for implementation in monolithic integrated circuits.

BACKGROUND OF THE INVENTION

In digital electronic systems, it is frequently desirable to generate a digital logic signal that is delayed by an accurate, predetermined amount of time with respect to the trasition of another logic signal. In many of these applications, it is important that the time delay be essentially independent of power supply voltage variations and of ambient temperature variations. (As used herein, the term "essentially" means closely approximating to a degree sufficient for practical purposes.) Circuits utilized to generate such delays include multi-stage hybrid delay lines which typically use small discrete or thick-film inductors and capacitors as the primary elements for establishing the delay of each delay stage. Other circuits utilized for generating accurate delays include monostable multivibrator integrated circuits (also known as "one shots") which typically use external resistors and capacitors for establishing the desired delay.

By comparison to monolithic integrated circuits, though, circuits which require thick film or discrete components tend to be more expensive to manufacture and not as reliable.

Delay circuits have heretofore been implemented in monolithic integrated circuits. Two such integrated circuits are the Dallas Semiconductor Corporation's DS1000 and DS1002. The time delay of each stage in these circuits is primarily determined by the time required to discharge a capacitive element through an MOS field effect transistor. The rate of discharge is controlled by a bias voltage applied to the gate terminal of the field effect transistor. The bias voltage is varied with temperature in a manner to effectively compensate for temperature-induced variations in the field effect transistor. To minimize sensitivity of these monolithic integrated circuits to variations in power supply voltage, circuitry is included therein for producing an on-chip reference voltage which is highly stable with power supply voltage and temperature variations. Such circuitry, however, requires a significant amount of chip area.

In accordance with the foregoing, a need exists for a simple delay stage which can conveniently be fabricated in a monolithic integrated circuit and which is essentially insensitive to variations in the power supply voltage and ambient temperature.

SUMMARY OF THE INVENTION

This invention provides a simple delay circuit which is essentially independent of variations in power supply voltage and ambient temperature, and which may be implemented in a small amount of area in a monolithic integrated circuit.

In accordance with one aspect of the present invention, a delay circuit includes a capacitive element which is charged through a resistive element from ground toward a power supply voltage. A voltage comparator compares the voltage on the capacitive element with that of a reference voltage. The reference voltage is generated at the common node of a resistor divider formed by two resistive elements connected in series between ground and the power supply voltage. For a constant temperature, the time delay provided by the circuit is essentially independent of variations in the power supply voltage.

In accordance with another aspect of the invention, the two resistive elements which provide the reference voltage have differing temperature coefficients of resistance, causing the reference voltage to increase and decrease in a predetermined manner in response to changes in the ambient temperature. Consequently, because the switching threshold of the voltage comparator varies with changes in temperature, the time delay associated with the time required to charge the capacitor from ground to the switching threshold of the comparator is a function of temperature. Such temperature-induced changes in delay can advantageously be utilized to compensate for opposite temperature-induced changes in the delay of inverters, buffers, or other circuitry in a delay path. Accordingly, the overall delay of a delay path can be made to be essentially independent of variations in temperature.

In one embodiment of the invention, included in one of the resistive elements of the resistor divider which generates the reference voltage for the voltage comparator is a plurality of P-well resistors, a plurality of polysilicon resistors, and a plurality of laser-fusible links. These elements are arranged such that the resistance and the temperature coefficient of resistance of one of the resistive elements can be selected by the selective opening of the laser-fusible links associated therewith. The other resistive element of the resistor divider includes a plurality of polysilicon resistors and a plurality of laser-fusible links, arranged such that the resistance can be selected by the selective opening of the laser-fusible links associated therewith. Because the temperature coefficient of resistance of the P-well resistors is much greater than that of the polysilicon resistors, the reference voltage produced at the common node of the resistor divider varies in a predetermined manner with changes in temperature.

The aforementioned and other features, characteristics, advantages, and the invention in general, will be better understood from the following detailed description of an illustrative embodiment when taken in conjunction with the accompanying drawings.

DETAILED DESCRIPTION OF A PREFERRED EMBODIMENT

Figure 1:
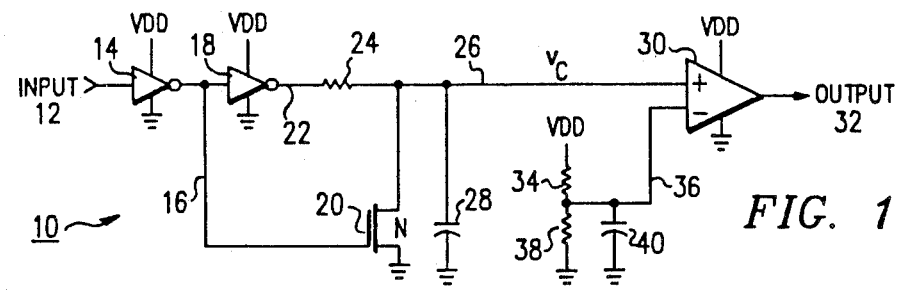
FIG. 1 is an electrical schematic diagram of the basic delay circuit in accordance with the present invention.

Referring now to FIG. 1, an embodiment of a delay circuit according to the present invention is indicated generally by the reference numeral 10. The delay circuit 10 is preferably fabricated using CMOS integrated circuit process technology to produce both N-channel and P-channel enhancement-mode MOSFET transistors in a monolithic integrated circuit. Each of the P-channel enhancement-mode MOSFET transistors embodied in the delay circuit 10 has a threshold voltage to become conductive of approximately negative 0.7 volts from gate to source, and each of the N-channel enhancement-mode MOSFET transistors has a threshold voltage to become conductive of approximately positive 0.7 volts from gate to source.

The delay circuit 10 includes an input node 12 which is connected to the input of an inverter 14. The inverter 14 is a conventional CMOS inverter comprising a P-channel enhancement-mode transistor and an N-channel enhancement-mode transistor, the transistors being connected in series between the ground reference voltage (GND) and a power supply node which is herein designated as VDD.

VDD is typically powered from a power source external to the monolithic integrated circuit, and typically is at a positive 5.0 volts with respect to GND. In a typical electronic system, however, VDD may vary by plus or minus 10 percent with changes in time, temperature, and loading.

In the preferred embodiment, the width to length ratio, W/L, of the N-channel transistor of the inverter 14 is made to be approximately six times that of the P-channel transistor of the inverter 14. Such an imbalance in the width to length ratio of the transistors causes the switching threshold of the inverter 14 to be at approximately 1.5 volts. Such a low switching threshold helps to minimize signal delay through the inverter 14 with respect to the leading edge of an input signal applied to the input node 12.

The output of the inverter 14, designated as node 16, is coupled to the input of an inverter 18 and to the gate of an N-channel enhancement-mode transistor 20. Like the inverter 14, the inverter 18 is a conventional CMOS inverter having a P-channel enhancement-mode MOSFET transistor and an N-channel enhancement-mode MOSFET transistor, the transistors having their gates connected together and to the input of the inverter, the drains of the transistors being connected together and to the output of the inverter, the source of the N-channel transistor being connected to GND, and the source of the P-channel transistor being connected to VDD. For the inverter 18, though, the W/L of the P-channel transistor is made to be approximately four times that of the N-channel transistor in order that the switching threshold of the inverter 18 will be relatively close to VDD, thereby tending to minimize delay through the inverter 18 with respect to the falling edge of a signal at its input. The output of the inverter 18 is connected to an internal signal node 22.

A resistive element 24 is connected between the internal signal node 22 and an internal signal node 26. As described more fully hereinbelow in conjunction with FIG. 4, the resistance of the resistive element 24 is selectable over a range of approximately 500 ohms to 10,000 ohms by the selective opening of laser-fusible links. It is desirable that a signal voltage on the internal signal node 22 transitions from GND to VDD at a much faster rate than the related signal on the internal signal node 26. Consequently, the output resistance of the inverter 18 is preferably made small with respect to the resistance of the resistive element 24, and stray capacitance on the internal signal node 22 is preferably minimized.

A capacitive element 28 is connected between the internal signal node 26 and GND. As described more fully hereinbelow in conjunction with FIG. 4, the capacitance of the capacitive element 28 is selectable to a maximum value of approximately 17.1 pF by the selective opening of laser-fusible links.

The drain of the N-channel transistor 20 is connected to the internal signal node 26, and the source of the N-channel transistor 20 is connected to GND. The width to length ratio of the N-channel transistor 20 is made fairly large, typically 100/3, in order that the capacitive element 28 can rapidly be discharged when the signal on the node 16 transitions from a low to a high voltage.

The internal signal node 26 is coupled to the non-inverting input of a voltage comparator 30. The output of the voltage comparator 30 is connected to an output node 32. The voltage comparator 30 is powered from VDD and GND, and is of conventional design. When the voltage applied to the non-inverting input is less than a reference voltage being applied to the inverting input, the output of the comparator is at or near GND (logic 0); but when the voltage applied to the non-inverting input is greater than that of the reference voltage, the output of the comparator is at or near VDD (logic 1).

A resistive element 34 is connected between VDD and a node 36. A resistive element 38 is connected between the node 36 and GND. The resistive elements 34 and 38 thus comprise a resistor divider—establishing on the node 36 a reference voltage having a value between VDD and GND. The node 36 is connected to the inverting input of the voltage comparator 30, and a capacitive element 40 is connected between the node 36 and GND. As more fully described hereinbelow in conjunction with FIG. 5, the resistances of the resistive elements 34 and 38, and the capacitance of the capacitive element 40, are selectable by the selective opening of laser-fusible links.

Figure 2:
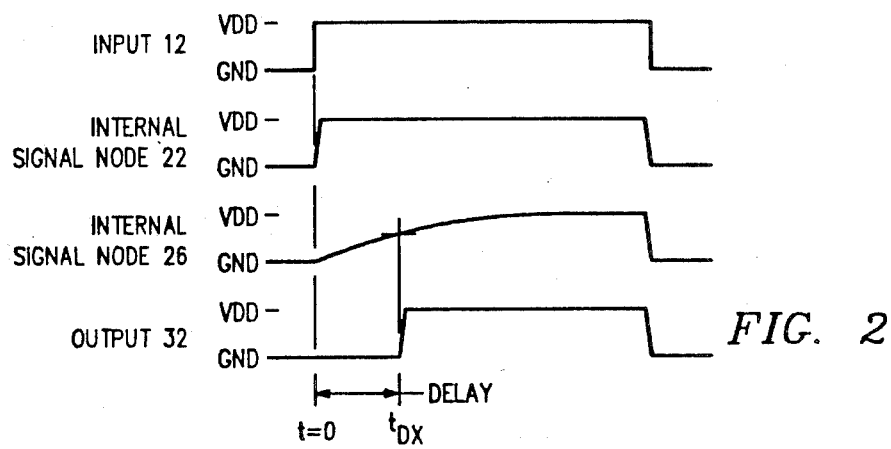
FIG. 2 is a timing diagram corresponding to operation of the delay circuit of FIG. 1.

Referring now to FIG. 2, operation of the delay circuit 10 of FIG. 1 is next described. Before time t=0, the input node 12 is at a low voltage near GND, the node 16 is near VDD, and the internal signal nodes 22 and 26 are close to GND. Because the non-inverting input of the voltage comparator 30 is at a lower voltage than that which is being applied to the inverting input, the output node 32 is also at a or near GND. At time t=0, the input node 12 transitions to a voltage greater than the switching threshold of the inverter 14, causing the node 16 to go low. The N-channel transistor 20 becomes non-conductive and, after a short delay, the inverter 18 provides a signal on the internal signal node 22 that transitions substantially from GND to VDD. The voltage on the internal signal node 26 begins rising toward VDD as the capacitive element 28 is charged through the resistive element 24. When the voltage on the internal signal node 26 becomes greater than the reference voltage on the node 36, the output node 32 transitions from GND to a voltage near VDD.

The delay circuit 10 thus provides an output signal that is delayed with respect to the leading edge of a signal applied to its input, such delay being designated as $t_{DX}$ in FIG. 2. By design, only a small portion of $t_{DX}$ is attributable to delays through the inverters 14 and 16 and the voltage comparator 30; instead, the delay $t_{DX}$ is primarily determined by the RC time constant of the resistive element 24 and the capacitive element 28, and by the switching threshold of the voltage comparator 30, the switching threshold of the voltage comparator 30 being set by and approximately equal to the voltage on the node 36.

Later in the cycle illustrated in FIG. 2, the input node 12 transitions back to a low voltage, the inverter 14 causes the node 16 to go high, and the inverter 18 causes the internal signal node 22 to transition to GND. The internal signal node 26 also transitions to GND as the capacitive element 28 is discharged through the N-channel transistor 20 and the resistive element 24. For an alternative embodiment in which a substantial delay can be tolerated on the trailing edge of the input signal, the N-channel transistor 20 can be eliminated.

Figure 3:
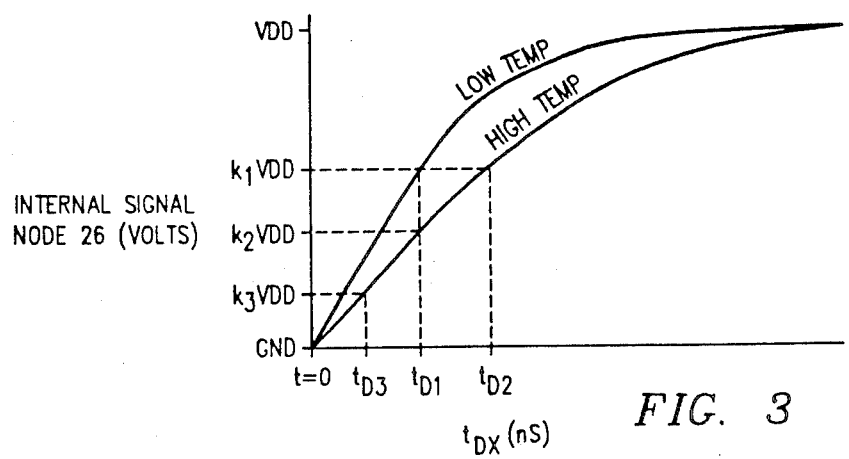
FIG. 3 illustrates plots of the voltage across the capacitive element of FIG. 1 during operation of the circuit at different temperatures.

Referring now to FIG. 3, the leading edge voltage of the internal signal node 26 as a function of time is illustrated in more detail and at two different ambient temperatures. The basic equation for the voltage $v_C$ across a capacitor C being charged toward the voltage VDD through a resistance R is:

$$v_C = VDD(1 - e^{-t/RC}) \quad (1)$$

Applying equation (1) to operation of the delay circuit 10 and choosing the switching threshold of the voltage comparator 30 to be equal to a constant fraction or percentage $k_1$ of VDD, then $$k_1 VDD = VDD(1 - e^{-t_{DX}/RC}) \quad (2)$$

where R is the resistance of the resistive element 24 and C is the capacitance of the capacitive element 28. Solving for the delay $t_{DX}$ gives $$t_{DX} = RC \ln\{1/(1 - k_1)\} \quad (3)$$

For the given conditions, it is thus seen that the time required to charge the capacitive element 28 from GND to a constant fraction of VDD is independent of the value of VDD. Accordingly, the delay $t_{DX}$ of the delay circuit 10 can essentially be made to be independent of variations in VDD by causing the reference voltage applied to the node 36 to be a fixed percentage of VDD. A reference voltage having this desired characteristic is generated by the resistor divider comprised of the resistive elements 34 and 38. Thus, the delay of the delay circuit 10 is essentially insensitive to variations of the power supply voltage.

Equation (3), however, reveals that the delay $t_{DX}$ will vary with temperature if either the resistance or the capacitance is a function of temperature. With present MOSFET monolithic integrated circuits technology, capacitive elements can readily be fabricated that are essentially independent of temperature; practical resistive elements, though, are not independent of temperature. Thus, as shown in FIG. 3, if the voltage comparator 30 has a constant switching threshold of $k_1 VDD$, the RC time delay will increase from $t_{D1}$ at low temperature to $t_{D2}$ at high temperature if the charging resistive element has a positive temperature coefficient of resistance. But if the switching threshold of the voltage comparator is reduced to $k_2 VDD$ at the higher temperature, it can be seen from FIG. 3 that the time delay is unchanged.

As a second-order effect, though, the small (but possibly significant) delays through the inverters 14 and 16 and the voltage comparator 30 typically increase with increasing temperature. In cases where these delays are significant, those delays can be compensated for by reducing the switching threshold of the voltage comparator 30 even further. For example, as illustrated in FIG. 3, reducing the switching threshold to $k_3 VDD$ at high temperature causes the RC-determined portion of the overall delay to be reduced to $t_{D3}$, which is less than $t_{D1}$.

From the foregoing, it will be appreciated that the temperature-related delay characteristics of the delay circuit 10 are primarily determined by temperature-induced changes in resistance of the resistive element 24 and by the manner in which the switching threshold of the voltage comparator 30 varies with temperature.

Figure 4:
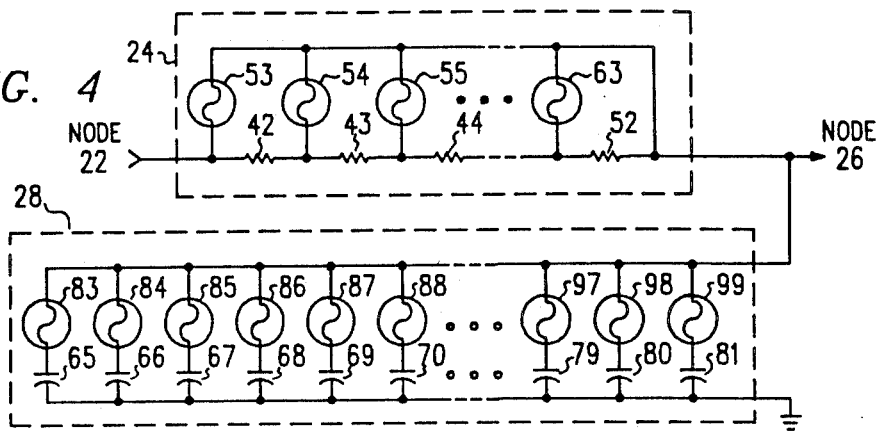
FIG. 4 is an electrical schematic diagram illustrating details of an embodiment of the resistive and capacitive timing elements of the circuit of FIG. 1.

Referring now to FIG. 4, an embodiment of the resistive element 24 and the capacitive element 28 is illustrated. The resistive element 24 includes eleven polysilicon resistors connected in series. These are designated herein as polysilicon resistors 42 through 52. The two left-most polysilicon resistors as viewed in FIG. 4, polysilicon resistors 42 and 43, are each approximately 100 microns long and 3 microns wide; the other polysilicon resistors, polysilicon resistors 44 through 52, are approximately 200 microns long and 3 microns wide. Each of the polysilicon resistors is fabricated from polysilicon material having a resistivity of approximately 15 ohms per square at room temperature, and havin a positive temperature coefficient of resistance of approximately 1,000 parts per million per degree Centigrade (PPM). Accordingly, the polysilicon resistors 42 and 43 each have a typical resistance at room temperature of approximately 500 ohms, and the polysilicon resistors 44 through 52 each have a resistance of approximately 1,000 ohms at room temperature. To minimize capacitive coupling effects each of the polysilicon resistors 42 through 52 is fabricated above a grounded P-well and below a grounded metal plate.

Also included in the resistive element 24 are eleven laser-fusible links, designated herein as laser-fusible links 53 through 63. Each of these has a terminal connected to the right-most end of the resistive element 24 as viewed in FIG. 4. The other ends of the laser-fusible links 53 through 63 are connected to the other nodes of the resistive element 24, a separate laser-fusible link being connected to each such node. Each of the laser-fusible links is formed in a conventional manner from a relatively short length of polysilicon (for low resistance) and may readily and selectively be opened with a laser beam in order to adjust the resistance of the resistive element 24. Selectively opening the laser-fusible links 53 through 58, for example, would set the typical room temperature resistance of the resistive element 24 to approximately 5,000 ohms.

As illustrated in FIG. 4, the capacitive element 28 includes seventeen capacitors, designated herein as capacitors 65 through 81. One terminal of each of these capacitors is connected to GND, and the other terminal of each is connected through a laser-fusible link—designated herein as laser-fusible links 83 through 99—to the internal signal node 26. Each of the capacitors 65 through 81 is fabricated with a polysilicon electrode which is separated by thin oxide from the other electrode which is formed by a heavily doped N-type region in a P-well. The N-region and the P-well of each capacitor are connected to ground. The polysilicon electrode of each capacitor is shielded by a grounded metal plate.

The capacitor 81 is made with an area of approximately 6,400 square microns which, at 0.6 pF per 625 square microns, provides a capacitance of approximately 6.4 pF. The capacitor 80 has an area of approximately 5,120 square microns and, accordingly provides a capacitance of approximately 5 pF. Each of the capacitors 70 through 79 is made to have an area of approximately 512 square microns and thus provides approximately 0.5 pF. In order that the capacitance of the capacitive element 28 can be adjusted quite finely, the areas of the capacitors 65 through 69 increase in a binary relationship with respect to each other, the capacitor 65 having an area of only approximately 25 square microns. The areas of the capacitors 66 through 69 are approximately 50, 100, 200, and 400 square microns, respectively. The laser-fusible links 83 through 99 are fabricated and can be selectively opened in the same manner as discussed with respect to the laser-fusible links 53 through 63.

From the foregoing, it should be appreciated that a wide and finely-selectable range of RC values is available for establishing the room temperature delay of the delay circuit 10.

Figure 5:
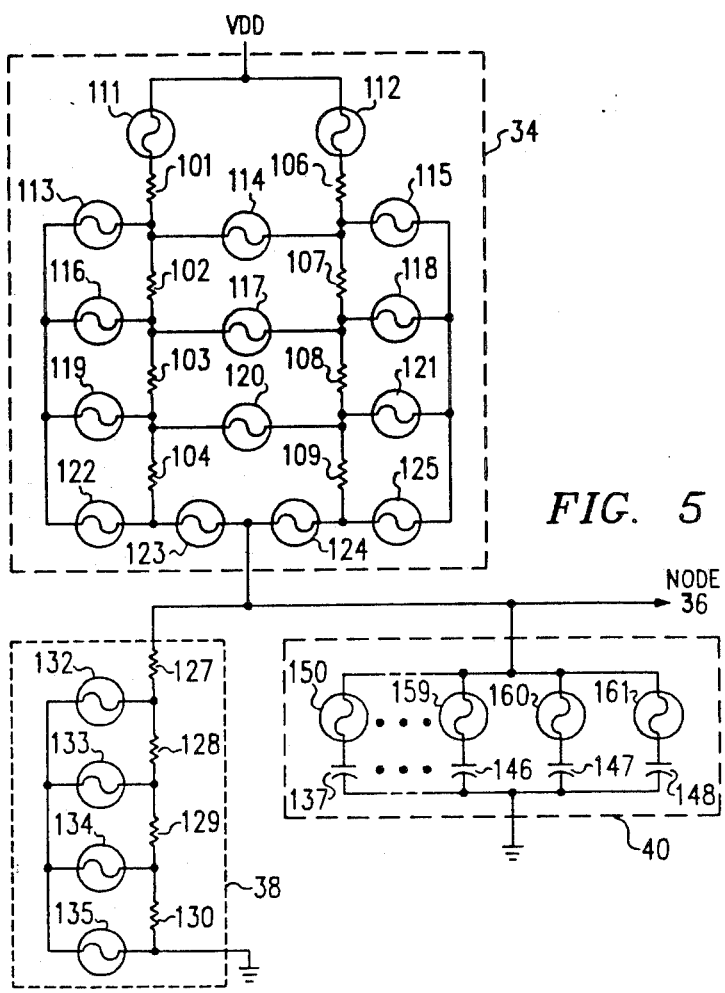
FIG. 5 is an electrical schematic diagram illustrating details of an embodiment of the resistor divider and associated capacitor of the circuit of FIG. 1.

Referring now to FIG. 5, details of an embodiment of the resistive elements 34 and 38 and of the capacitive element 40 are shown. The resistive element 34 includes four series-connected polysilicon resistors 101 through 104. These polysilicon are fabricated in the same manner and have the same characteristics as the polysilicon resistors 44 through 52 but each is approximately 1000 microns long and 3 microns wide. Thus, each of the polysilicon resistors 101 through 104 has a typical resistance of approximately 5,000 ohms at room temperature and a positive temperature coefficient of resistance of approximately 1,000 PPM. The resistive element 34 additionally includes four series-connected P-well resistors 106 through 109. Each of these P-well resistors is fabricated to have a typical resistance of approximately 5,000 ohms and a positive temperature coefficient of resistance of approximately 6,000 PPM. Thus, the temperature coefficient of resistance of the P-well resistors is substantially different from that of the polysilicon resistors. Further included in the resistive element 34 are fifteen laser-fusible links 111 through 125 of the same type as hereinbefore described. As illustrated, the laser-fusible links 111 through 125 are arranged in such a manner that any number of the series-connected polysilicon resistors 101 through 104 can be connected in parallel with any numbers of the series-connected P-well resistors 106 through 109. By the selective opening of the laser-fusible links 111 through 125, a large number of resistance values and a large number of differing temperature coefficients of resistance can be selected for the resistive element 34.

The resistive element 38 includes four series-connected polysilicon resistors 127 through 130, each having a typical resistance at room temperature of approximately 5,000 ohms and having a positive temperature coefficient of resistance of approximately 1,000 PPM. The resistive element 38 additionally includes four laser-fusible links 132 through 135 of the same type as hereinbefore described. The laser-fusible links 132 through 135 are interconnected with the polysilicon resistors 127 through 130 in such a manner as to allow the resistance of the resistive element 38 to be selected in 5,000 ohm increments from approximately 5,000 ohms to 20,000 ohms.

For a case in which one or more of the P-well resistors 106 through 109 are selected to contribute a significant amount of resistance to the resistive element 34, it will be appreciated that the voltage generated at the node 36 decreases with increasing temperature because the resistance of the resistive element 34 increases as at a faster rate than that of the resistive element 38. Thus, a predetermined reduction in the switching threshold of the voltage comparator 30 is obtained (with the selection of opened laser-fusible links being based upon calculations or upon laboratory empirical measurements).

The capacitive element 40 is connected from the node 36 to GND for the purpose of approximately balancing the amount of capacitance which is connected to each of the two inputs of the voltage comparator 30. An objective of balancing these capacitances is to minimize the effects of transient signals or noise that might be coupled simultaneously to both inputs of the voltage comparator 30. Thus, it is preferable that the capacitance of the capacitive element 40 be approximately the same as that of the capacitive element 28. Similarly, it is desirable that the parallel resistance of the resistive elements 34 and 38 be approximately the same as the resistance of the resistive element 24.

As illustrated in FIG. 5, the capacitive element 40 includes twelve capacitors 137 through 148, each of which has one terminal connected to GND and the other terminal connected through one of twelve laser-fusible links 150 through 161 to the node 36. The laser-fusible links 150 through 161 are of the same type as heretofore described. The capacitors 137 through 148 are fabricated in the same manner as the capacitors 70 through 81. Accordingly, the capacitor 148 has a capacitance of approximately 6.4 pF, the capacitor 147 has a capacitance of approximately 5 pF, and the capacitors 137 through 146 each has a capacitance of approximately 0.5 pF. In the preferred embodiment, capacitors analogous to the capacitors 65 through 69 (which form a binary array in the capacitive element 28) are not included in the capacitive element 40. Such capacitors could be included in an alternative embodiment, but for the embodiment illustrated, it is believed to not be necessary to perfectly match the capacitances of the capacitive elements 40 and 28. Accordingly, the laser-fusible links 150 through 161 are selectively opened to make the capacitance of the capacitive element 40 approximate that of the capacitive element 28.

The delay circuit of the present invention should be readily understood from the foregoing description, and it should be apparent that various changes may be made in form, construction, and arrangement of the delay circuit without departing from the spirit and scope of the invention. For example, similar circuitry can be used whereby the capacitive timing element is discharged toward GND rather than charging toward VDD. For another example, it is not necessary that the capacitive timing element only be charged or discharged between GND and the power supply voltage VDD; instead, the capacitive timing element can be charged or discharged betwen other reference voltages which may be available.

What is claimed is:

1. A delay circuit fabricated in a monolithic integrated circuit, said delay circuit having an input node for receiving an input signal, having a first DC reference voltage node for receiving a first DC reference voltage, having a second DC reference voltage node for receiving a second DC reference voltage, and having a first internal signal node, a second internal signal node, and an output node, comprising:
  a. means responsive to a logic state transition of said input signal for providing a signal on said first internal signal node that transitions substantially from said first DC reference voltage to said second DC reference voltage;
  b. a first resistive element connected between said first internal signal node and said second internal signal node;
  c. a capacitive element connected between said second internal signal node and said first DC reference voltage node;
  d. voltage divider means coupled between said first DC reference voltage node and said second DC voltage reference node for generating on a third DC voltage reference node a third DC reference voltage having a value equal to said first DC reference voltage plus a substantially fixed percentage of the voltage difference between said first and second DC reference voltages; and
  e. a voltage comparator having two inputs and an output, one of said voltage comparator inputs being connected to said second internal signal node, the other of said voltage comparator inputs being coupled to said third DC reference voltage node, the output of said voltage comparator being coupled to the output node of said delay circuit, said voltage comparator generating a logic state transition on its output when the voltage on said second internal signal node transitions from being less than said third DC reference voltage to greater than said third DC reference voltage;
whereby a delay output signal may be provided and whereby the amount of delay is substantially independent of variations in the voltage difference between said first and second reference voltages.

2. The delay circuit according to claim 1 wherein said first resistive element is a network comprising a plurality of resistors and a plurality of laser-fusible links wherein the resistance of said first resistive element can be increased by the selective opening of said laser-fusible links.

3. The delay circuit according to claim 1 wherein said capacitive element is a network comprising a plurality of capacitors and a plurality of laser-fusible links wherein the capacitance of said capacitive element can be decreased by the selective opening of said laser-fusible links.

4. The delay circuit according to claim 1 further including means responsive to said input signal and connected in parallel with said capacitive element for rapidly discharging said capacitive element.

5. The delay circuit according to claim 1 wherein said means for generating a third DC reference voltage comprises second and third resistive elements coupled in series between said first and second DC reference voltage nodes, said third DC reference voltage node comprising a node between said second and third resistive elements.

6. The delay circuit according to claim 5 wherein the resistances of said second and third resistive elements are separately increasingly adjustable by the selective opening of laser-fusible links.

7. A delay circuit fabricated in a monolithic integrated circuit, said delay circuit having an input node for receiving an input signal, having a first DC reference voltage node for receiving a first DC reference voltage, having a second DC reference voltage node for receiving a second DC reference voltage, and having a first internal signal node, a second internal signal node, and an output node, comprising:
  a. means responsive to a logic state transition of said input signal for providing a signal on said first internal signal node that transitions substantially from said first DC reference voltage to said second DC reference voltage;
  b. a first resistive element connected between said first internal signal node and said second internal signal node;
  c. a capacitive element connected between said second internal signal node and said first DC reference voltage node;
  d. voltage divider means coupled between said first DC reference voltage node and said second DC voltage reference node for generating on a third DC voltage reference node a third DC reference voltage intermediate in value between said first and second reference voltages and increasing and decreasing in value in a predetermined manner in response to increases and decreases in the ambient temperature; and
  e. a voltage comparator having two inputs and an output, one of said voltage comparator inputs being connected to said second internal signal node, the other of said voltage comparator inputs being coupled to said third DC reference voltage node, the output of said voltage comparator being coupled to the output node of said delay circuit, said voltage comparator generating a logic state transition on its output when the voltage on said second internal signal node transitions from being less than said third DC reference voltage to greater than said third DC reference voltage;
whereby a temperature-compensated delayed output may be provided.

8. The delay circuit according to claim 7 wherein said means for generating a third DC reference voltage comprises a second resistive element coupled in series with a third resistive element between said first and second DC reference voltage nodes, said third DC reference voltage node comprising a node between said second and third resistive elements, said second and third resistive elements having differing temperature coefficients of resistance.

9. The delay circuit according to claim 8 wherein:
  a. said second resistive element is comprised of a plurality of P-well resistors, a first plurality of polysilicon resistors having temperature coefficients of resistance differing from that of said P-well resistors, and a first plurality of laser-fusible links, said pluralities of resistors and laser-fusible links being interconnected in a first network wherein the resistance and temperature coefficient of resistance of said first resistive element can be selected by the selective opening of said first plurality of laser-fusible links; and
  b. said third resistive element comprises a second network of a second plurality of polysilicon resistors and a second plurality of laser-fusible links wherein the resistance of said second resistive element can be selected by the selective opening of said second plurality of laser-fusible links.

* * * * *